United States Patent
Chen (10) Patent No.: US 11,545,894 B2
(45) Date of Patent: Jan. 3, 2023

(54) ELECTROMAGNETIC INTERFERENCE REDUCING CIRCUIT

(71) Applicant: ANPEC ELECTRONICS CORPORATION, Hsinchu (TW)

(72) Inventor: Li-Wei Chen, Hsinchu (TW)

(73) Assignee: ANPEC ELECTRONICS CORPORATION, Hsinchu (TW)

( * ) Notice: Subject to any disclaimer, the term of this patent is extended or adjusted under 35 U.S.C. 154(b) by 175 days.

(21) Appl. No.: 17/191,932

(22) Filed: Mar. 4, 2021

(65) Prior Publication Data
US 2022/0115946 A1    Apr. 14, 2022

(30) Foreign Application Priority Data
Oct. 12, 2020    (TW) .................................. 109135123

(51) Int. Cl.
| H02M 1/44 | (2007.01) |
| H03K 3/84 | (2006.01) |
| H02P 7/293 | (2016.01) |

(52) U.S. Cl.
CPC .............. *H02M 1/44* (2013.01); *H02P 7/293* (2016.02); *H03K 3/84* (2013.01)

(58) Field of Classification Search
CPC . H02M 1/44; H02M 1/08; H02P 7/293; H02P 6/085; H02P 6/26; H03K 3/84
See application file for complete search history.

(56) References Cited

U.S. PATENT DOCUMENTS 5,811,954 A * 9/1998 Randall ............... H02P 25/0925
                                                           318/400.11
5,929,683 A * 7/1999 Menkhoff ............. H04B 15/04
                                                           327/299
(Continued)

FOREIGN PATENT DOCUMENTS

| TW | 200849848 A | 12/2008 |
| TW | 201701580 A | 1/2017 |

OTHER PUBLICATIONS

Jian Liu; Bo Zhao; Xin-Wei Wang; Dun-Xin Bian; Sheng-Tong Sun.,"Noise Suppression Technology for DTP-PMSM Based on Dual Random Modulation Strategy",2019 22nd International Conference on Electrical Machines and Systems, Aug. 2019.

*Primary Examiner* — Rina I Duda
(74) *Attorney, Agent, or Firm* — Li & Cai Intellectual Property (USA) Office (57) ABSTRACT

An electromagnetic interference reducing circuit is provided. A first random number generator generates a plurality of first random number signals each having a plurality of triangular waves. Each of the triangular waves has a plurality of steps. The first random number generator generates a plurality of first random numbers and modulates each of the first random number signals according to the first random numbers. The first random number generator repeatedly counts, repeatedly removes, or does not count time of the steps of each of the triangular waves of each of the first random number signals according to one of the first random numbers. A first oscillator generates a first oscillating signal. A motor controller circuit controls a plurality of switch components of a motor respectively according to the first random number signals based on the first oscillating signal.

15 Claims, 7 Drawing Sheets

(56) References Cited

U.S. PATENT DOCUMENTS

| | | | | |
|---|---|---|---|---|
| 5,986,418 A | * | 11/1999 | Horst | H02P 25/08 |
| | | | | 318/400.23 |
| 7,342,528 B2 | * | 3/2008 | Ng | H03K 3/0315 |
| | | | | 375/130 |
| 7,809,056 B2 | | 10/2010 | Chang | |
| 9,602,030 B2 | | 3/2017 | Chen | |
| 2003/0174005 A1 | * | 9/2003 | Latham, II | H04B 15/04 |
| | | | | 327/172 |
| 2010/0244761 A1 | * | 9/2010 | Galbiati | H02P 6/22 |
| | | | | 318/599 |
| 2017/0264303 A1 | * | 9/2017 | Sekido | H03L 7/0891 |

* cited by examiner

ELECTROMAGNETIC INTERFERENCE REDUCING CIRCUIT

CROSS-REFERENCE TO RELATED PATENT APPLICATION

This application claims the benefit of priority to Taiwan Patent Application No. 109135123, filed on Oct. 12, 2020. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to an electromagnetic interference reducing circuit, and more particularly to an electromagnetic interference reducing circuit for a motor.

BACKGROUND OF THE DISCLOSURE

With continuous development of various electronic products, motors have become important components of the electronic products. As higher requirements are placed on the electronic products, higher power performance is also required of the motor. The high power performance of the motor has become an important performance index for testing the electronic products. However, high electromagnetic radiation energy generated by the motor (in particular for a DC brush motor) directly affects an electromagnetic environment of human life and causes serious interference to normal operations of other system circuits in the electronic product.

SUMMARY OF THE DISCLOSURE

In response to the above-referenced technical inadequacies, the present disclosure provides an electromagnetic interference reducing circuit of a motor. The motor is connected to a motor driver circuit, and the motor driver circuit includes a plurality of switch components connected to the motor. The electromagnetic interference reducing circuit includes a first oscillator, a first random number generator and a motor controller circuit. The first oscillator is configured to generate a first oscillating signal. A first random number generator is configured to generate a plurality of first random number signals each having a plurality of triangular waves. Each of the triangular waves has a plurality of steps. The first oscillator is configured to generate a plurality of first random numbers. Each time when a first clock signal reaches a reference level, the first random number generator modulates one of the triangular waves of each of the first random number signals according to one of the first random numbers. The first random number generator repeatedly counts, repeatedly removes, or does not count time of the steps of each of the triangular waves of each of the first random number signals according to one of the first random numbers, such that each one of periods of the first random number signal is adjusted to not be equal to a next subsequent one of the periods of the first random number signal. The number of the steps of each of the triangular waves that are repeatedly counted, repeatedly removed or does not count time depends on the one of the first random number of each of the triangular waves. The motor controller circuit is connected to the first oscillator and the first random number generator. The motor controller circuit is configured to receive the first oscillating signal from the first oscillator and output the first clock signal to the first random number generator. The motor controller circuit is configured to control the switch components respectively according to the first random number signals based on the first oscillating signal.

In certain embodiments, when a previous one of the triangular waves of each of the first random number signals falls to a valley value, the first random number generator generates the first random number of a next one of the triangular waves, and modulates a rising wave segment and a falling wave segment of the next one triangular wave of each of the first random number signals according to the first random number of the next one triangular wave.

In certain embodiments, when a rising wave segment of a previous one of the triangular waves of each of the first random number signals rises to a peak value, the first random number generator generates one of the first random numbers, and modulates a falling wave segment of the previous one triangular wave and a rising wave segment of a next one of the triangular waves of each of the first random number signals according to the one first random number.

In certain embodiments, the motor driver circuit further includes a plurality of phase controller circuits. The phase controller circuits are connected to the motor controller circuit and respectively connected to the plurality of switch components. The motor controller circuit controls the phase controller circuits respectively to adjust phases of signals that will be inputted to the motor through the switch components according to the first random number signals.

In certain embodiments, the phase controller circuit includes a plurality of first phase controller circuits and a plurality of second phase controller circuits. The switch components include a plurality of hide-side switches and a plurality of low-side switches. The hide-side switches are p-type metal oxide semiconductor (PMOS) field effect transistors and respectively connected to the first phase controller circuits. The low-side switches are n-type metal oxide semiconductor (NMOS) field effect transistors and respectively connected to the second phase controller circuits.

In certain embodiments, the phase controller circuit includes a plurality of first phase controller circuits and a plurality of second phase controller circuits. The switch components include a plurality of hide-side switches and a plurality of low-side switches. The hide-side switches are n-type metal oxide semiconductor field effect transistors and respectively connected to the first phase controller circuits. The low-side switches are n-type metal oxide semiconductor field effect transistors and respectively connected to the second phase controller circuits.

In certain embodiments, the electromagnetic interference reducing circuit further includes a second random number generator, a second oscillator and a charging pump. The second oscillator is connected to the second random number generator and the charging pump. The charging pump is connected to the first phase controller circuits. The second oscillator outputs a second oscillating signal. Each time when the second oscillating signal reaches a reference level, the second random number generator generates a plurality of second random numbers and output a plurality of second random number signals respectively according to the second random numbers. The second oscillator modulates the second oscillating signal according to the second random number signals. The charging pump outputs a power signal to the motor sequentially through each of the first phase controller circuits and the high-side switches according to the second oscillating signal.

In certain embodiments, the second oscillator includes a first transistor, a second transistor, a comparator, a reference voltage circuit, a first modulator circuit, a second modulator circuit and a third modulator circuit. A first terminal of the first transistor and a second terminal of the first transistor are respectively connected to the first modulator circuit and a first terminal of the second transistor. The second random number generator is connected to the first modulator circuit, the second modulator circuit and the third modulator circuit. The second random number generator outputs the second random number signals for controlling the first modulator circuit, the second modulator circuit or the third modulator circuit. A first input terminal of the comparator is connected to the first terminal of the second transistor and the second modulator circuit. A second input terminal of the comparator and an output terminal of the comparator are connected to the reference voltage circuit. The reference voltage circuit outputs a reference voltage to the second input terminal of the comparator according to the second oscillating signal outputted by the comparator. The output terminal of the comparator is connected to a control terminal of the first transistor, a control terminal of the second transistor, the second random number generator and the charging pump. The comparator outputs the second oscillating signal to the first transistor, the second transistor, the second random number generator and the charging pump.

In certain embodiments, the first modulator circuit includes a plurality of first current sources and a plurality of first switches. The first current sources are respectively connected to first terminals of the first switches. A second terminal and a control terminal of each of the first switches are respectively connected to the first terminal of the first transistor and the second random number generator. The second random number generator outputs the second random number signals for respectively controlling the first switches.

In certain embodiments, the first random number generator further includes a second current source connected to the first terminal of the first transistor.

In certain embodiments, the first modulator circuits further includes a plurality of second switches and a plurality of third current sources. A first terminal of each of the second switches is connected to a second terminal of the second transistor. Second terminals of the second switches are respectively connected to the third current sources. A control terminal of each of the second switches is connected to the second random number generator. The second random number generator outputs the second random number signals for respectively controlling the second switches.

In certain embodiments, the first random number generator further includes a fourth current source connected to the second terminal of the second transistor.

In certain embodiments, the second modulator circuit includes a plurality of third switches, a first capacitor and a plurality of second capacitors. A first terminal of each of the third switches and a first terminal of the first capacitor are connected to the first input terminal of the comparator. Second terminals of the third switches are respectively connected to first terminals of the second capacitors. A second terminal of the first capacitor and a second terminal of each of the second capacitors are grounded. The second random number generator is connected to a control terminal of each of the third switches and outputs the second random number signals for respectively controlling the third switches.

In certain embodiments, the third modulator circuit includes a plurality of first resistors, a plurality of second resistors and a plurality of fourth switches. A first terminal of each of the first resistors is connected to a first input terminal of the reference voltage circuit. Second terminals of the first resistors are respectively connected to first terminals of the fourth switches. Second terminals of the fourth switches are respectively connected to first terminals of the second resistors. A second terminal of each of the second resistors is connected to a second input terminal of the reference voltage circuit. The second random number generator is connected to a control terminal of each of the fourth switches and outputs the second random number signals for respectively controlling the fourth switches.

In certain embodiments, the third modulator circuit further includes a third resistor, a fourth resistor, a fifth resistor and a sixth resistor. A first terminal of the third resistor is connected to the first input terminal of the reference voltage circuit. A second terminal of the third resistor is connected to a first terminal of the fourth resistor. A second terminal of the fourth resistor is connected to a first terminal of the sixth resistor. A second terminal of the sixth resistor is grounded. A first terminal of the fifth resistor is connected to a common voltage source. A second terminal of the fifth resistor is connected to the first terminal of the third resistor. The first terminal of the sixth resistor is connected to the second terminal of the fourth resistor.

As described above, the present disclosure provides the electromagnetic interference reducing circuit, which has the following characteristics:

1. the charging pump supplies the power according to the second oscillating signal that is generated based on the second random number signals, such that the voltage of the high-side switch that is the NMOS transistor of the motor increases;
2. when different switch components are used, the second oscillator selects different currents, voltages or capacitances to generate the second oscillating signal having different frequencies according to the second random numbers generated by the second random number generator;
3. when the present time reaches a time point of a rising edge or a falling edge of the second oscillating signal, or the second oscillating signal reaches a high or low level, a waveform of a next cycle of the second oscillating signal is changed according to the second random numbers generated by the second random number generator;
4. the first oscillator and the first random number generator are used to provide a correct operational frequency of the motor controller circuit;
5. the first random number generator is used to generate the first random number signal and modulate the frequency of the first random number signal according to the first random numbers, such that the motor drive circuit is correctly turned on or off based on the modulated first random number signal;
6. the first random number generator and the motor controller circuit are applied to the motor driver circuit to drive the motor, such that the frequencies of the signals of the motor change, thereby preventing the motor from being affected by the electromagnetic interference;

7. the second random number generator and the second oscillator are applied to the motor driver circuit to drive the motor, such that that the frequencies of the signals of the motor change, thereby preventing the motor from being affected by the electromagnetic interference; and 8. the second oscillator modulates the second oscillating signal according to the second random numbers generated by the second random number generator, and the charging pump adjusts a frequency of charging the motor according to the second oscillating signal, thereby preventing the motor from being affected by the electromagnetic interference.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Figure 1:
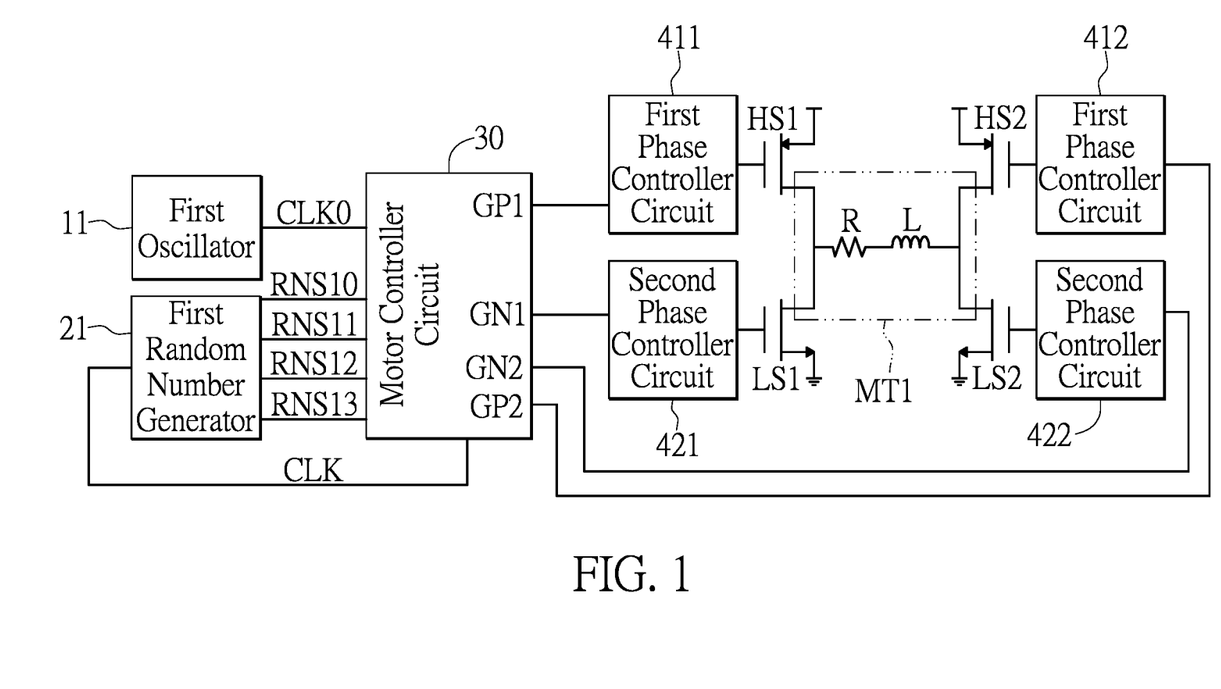
FIG. 1 is a circuit layout diagram of an electromagnetic interference reducing circuit, a single-phase motor, high-side switches that are PMOS transistors and low-side switches that are NMOS transistors according to a first embodiment of the present disclosure.
Figure 6:
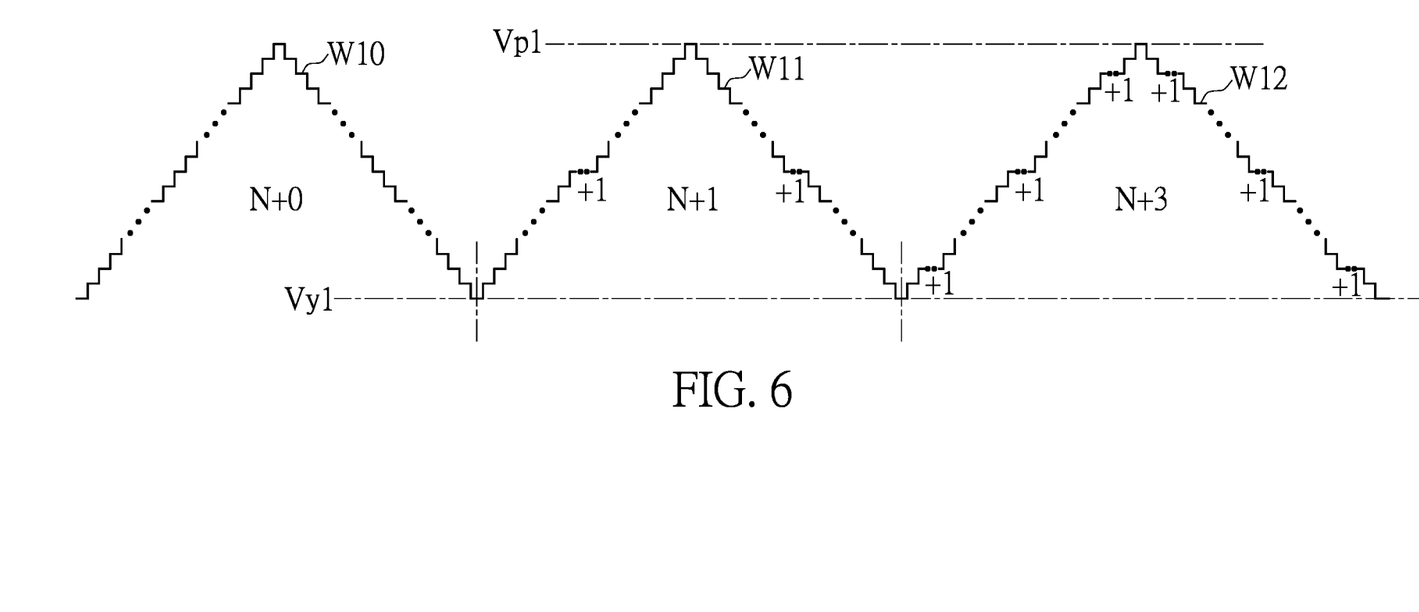
FIG. 6 is a signal waveform diagram of one first random number signal of the electromagnetic interference reducing circuit according to the first to fifth embodiments of the present disclosure.
Figure 7:
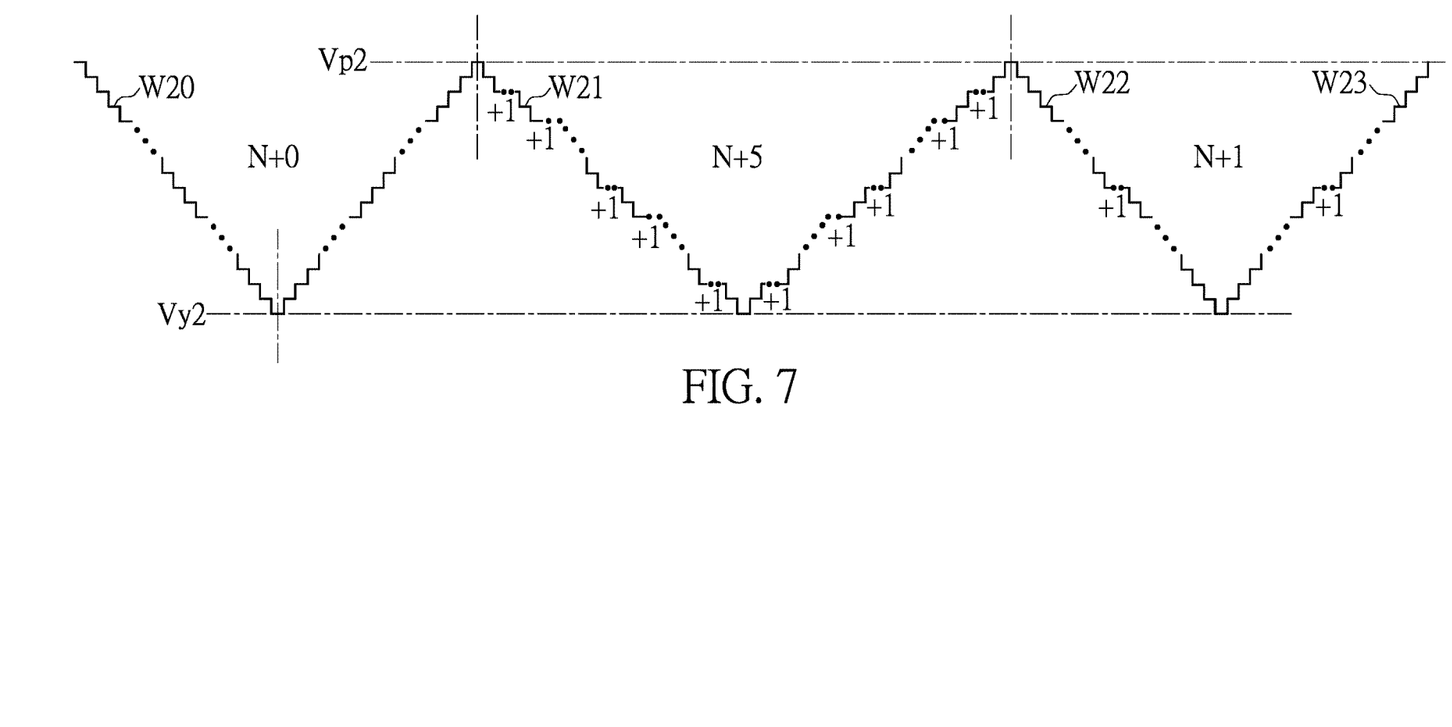
FIG. 7 is a signal waveform diagram of another first random number signal of the electromagnetic interference reducing circuit according to the first to fifth embodiments of the present disclosure.

Reference is made to FIGS. 1, 6 and 7, in which FIG. 1 is a circuit layout diagram of an electromagnetic interference reducing circuit, a single-phase motor, upper bridge switches that are PMOS transistors and lower bridge switches that are NMOS transistors according to a first embodiment of the present disclosure, FIG. 6 is a signal waveform diagram of one first random number signal of the electromagnetic interference reducing circuit according to the first to fifth embodiments of the present disclosure, and FIG. 7 is a signal waveform diagram of another first random number signal of the electromagnetic interference reducing circuit according to the first to fifth embodiments of the present disclosure.

In the embodiment, the electromagnetic interference reducing circuit may include a first oscillator 11, a first random number generator 21 and a motor controller circuit 30 for a motor (such as a single-phase motor MT1) as shown in FIG. 1. The single-phase motor MT1 is connected to a motor driver circuit. The motor driver circuit may include a plurality of switch components, such as a first hide-side switch HS1, a second hide-side switch HS2, a first low-side switch LS1 and a second low-side switch LS2 that are arranged to form an H-bridge driver circuit as shown in FIG. 1.

As shown in FIG. 1, the first hide-side switch HS1 and the second hide-side switch HS2 are p-type metal oxide semiconductor (PMOS) field effect transistors, and the first low-side switch LS1 and the second low-side switch LS2 are n-type metal oxide semiconductor (NMOS) field effect transistors, but the present disclosure is not limited thereto.

A first terminal of the first hide-side switch HS1 and a first terminal of the second hide-side switch HS2 may be connected to a common power source (not shown in figures). As shown in FIG. 1, a second terminal of the first hide-side switch HS1 is connected to a first terminal of the first low-side switch LS1 and a first terminal of a resistor R of the single-phase motor MT1. A second terminal of the resistor R is connected to a first terminal of an inductor L of the single-phase motor MT1. A second terminal of the inductor L of the single-phase motor MT1 is connected to a second terminal of the second hide-side switch HS2 and a first terminal of the second low-side switch LS2. The second terminal of the second hide-side switch HS2 is connected to the first terminal of the second low-side switch LS2. A second terminal of the first low-side switch LS1 and a second terminal of the second low-side switch LS2 are grounded.

If necessary, the motor driver circuit may further include a plurality of phase controller circuits, such as first phase controller circuits 411, 412 and second phase controller circuits 421, 422 as shown in FIG. 1.

The first phase controller circuit 411 is connected to a control terminal of the first hide-side switch HS1 and an output terminal GP1 of the motor controller circuit 30. The second phase controller circuit 421 is connected to a control terminal of the first low-side switch LS1 and an output terminal GN1 of the motor controller circuit 30. The first phase controller circuit 412 is connected to a control terminal of the second hide-side switch HS2 and an output terminal GP2 of the motor controller circuit 30. The second phase controller circuit 422 is connected to a control terminal of the second low-side switch LS2 and an output terminal GN2 of the motor controller circuit 30.

An output terminal of the motor controller circuit 30 may be connected to an input terminal of the first random number generator 21 and output a first clock signal CLK (such as a pulse width modulation signal) to the first random number generator 21. When each of waveforms of the first clock signal CLK reaches a reference level such as a high level or a low level, the first random number generator 21 may determine and generate a plurality of first random numbers, and generate a plurality of first random number signals RNS10, RNS11, RNS12, RNS13 respectively according to the first random numbers.

Each of the first random number signals RNS10, RNS11, RNS12, RNS13 has a plurality of triangular waves, such as triangular waves W10, W11, W12 shown in FIG. 6. As shown in FIG. 6, both of a rising wave segment and a falling wave segment of each of the triangular waves W10, W11, W12 have a plurality of steps.

It is worth noting that, the first random number generator 21 may repeatedly count, repeatedly subtract or not count time of the steps of each of the triangular waves of each of the first random number signals RNS10, RNS11, RNS12, RNS13 to modulate periods of the first random number signals RNS10, RNS11, RNS12 to be not equal to the same value. That is, each one of the periods of each of the first random number signals RNS10, RNS11, RNS12, RNS13 is not equal to a next subsequent one of the periods of each of the first random number signals RNS10, RNS11, RNS12, RNS13. As a result, a frequency of each of the first random number signals RNS10, RNS11, RNS12, RNS13 changes over time, thereby preventing the motor that is controlled according to the first random number signals RNS10, RNS11, RNS12, RNS13 from being affected by electromagnetic interference.

For example, as shown in FIG. 6, when a present time reaches a time point of a valley value Vy1 of the triangular wave W10 of the first random number signal (such as the first random number signal RNS10, RNS11, RNS12 or RNS13 as shown in FIG. 1), the first random number generator 21 generates a first random number "+0". The first random number generator 21 does not modulate the triangular wave W10 of the first random number signal according to the first random number "+0".

Then, when the present time reaches a time point of the valley value Vy1 of a triangular wave W11 of the first random number signal as shown in FIG. 6, the first random number generator 21 generates the first random number "+1". According to the first random number "+1", the first random number generator 21 repeatedly counts one of the plurality of steps of the rising wave segment of the triangular wave W11 of the first random number signal once. The first random number signal rises from the valley value Vy1 to a peak value Vp1 during a time interval of the rising wave segment of the triangular wave W11 of the first random number signal. Before the time of the one step is repeatedly counted, the time of the one step is represented by t. After the time of the one step is repeatedly counted, the time of the one step is doubled, which is calculated by t+t. According to the first random number "+1", the first random number generator 21 repeatedly counts one of the plurality of steps of the falling wave segment of the triangular wave W11 of the first random number signal. That is, the rising wave segment and the falling wave segment of the triangular wave W11 are modulated according to the same first random number "+1". The first random number signal falls from the peak value Vp1 to the valley value Vy1 during a time interval of the falling wave segment of the triangular wave W11 of the first random number signal. A time point at which the step of the rising wave segment of the triangular wave W11 is modulated may be aligned with a time point at which the step of the falling wave segment of the triangular wave W11 is modulated, but the present disclosure is not limited thereto.

Then, when the present time reaches a time point of the valley value Vy1 of the triangular wave W12 of the first random number signal as shown in FIG. 6, the first random number generator 21 generates the first random number "+3". According to the first random number "+3", the first random number generator 21 repeatedly counts the time of each of preset or any three ones of the plurality of steps of the rising wave segment of the triangular wave W12 of the first random number signal once. Similarly, according to the same first random number "+3", the first random number generator 21 repeatedly counts the time of each of preset or any three ones of the plurality of steps of the falling wave segment of the triangular wave W12 of the first random number signal once.

For example, when a present time reaches a time point of a peak value Vp2 of a triangular wave W20 of the first random number signal as shown in FIG. 7, the first random number generator 21 generates the first random number "+0". According to the first random number "+0", the first random number generator 21 does not modulate a falling wave segment of the triangular wave W20 of the first random number signal and does not modulate a rising wave segment of a next triangular wave W21. The first random number signal falls from the peak value Vp2 to the valley value Vy2 during a time interval of the falling wave segment of the triangular wave W20 of the first random number signal. The first random number signal rises from the valley value Vy2 to the peak value Vp2 during a time interval of the rising wave segment of the next triangular wave W21 of the first random number signal.

Then, when the present time reaches a time point of the peak value Vp2 of the triangular wave W21 of the first random number signal as shown in FIG. 7, the first random number generator 21 generates the first random number "+5". The first random number generator 21 repeatedly counts each of five ones of a plurality of steps of a falling wave segment of the triangular wave W21 once, according to the first random number "+5". Similarly, according to the same first random number "+5", the first random number generator 21 repeatedly counts each of five ones of a plurality of steps of a rising wave segment of a next triangular wave W22 once.

Then, when the present time reaches a time point of the peak value Vp2 of the triangular wave W22 of the first random number signal as shown in FIG. 7, the first random number generator 21 generates the first random number "+1". According to the first random number "+1", the first random number generator 21 repeatedly counts one of a plurality of steps of a falling wave segment of the triangular wave W22 once. Similarly, according to the same first random number "+1", the first random number generator 21 repeatedly counts one of a plurality of steps of a rising wave segment of a triangular wave W23 once.

As described above, the time of one or more of the plurality of steps of the triangular waves is counted repeatedly, but the present disclosure is not limited thereto. In practice, the time of the steps of the triangular waves of the first random number signal may be repeatedly removed or may not be counted.

According to one first random number of each of the triangular waves, the first random number generator 21 determines a number of the steps of each of the triangular waves that are repeatedly counted, repeatedly removed or not counted.

As shown in FIG. 1, the motor controller circuit 30 may be connected to an output terminal of the first oscillator 11 and an output terminal of the first random number generator 21. The first oscillator 11 is configured to generate a first oscillating signal CLK0. Based on the first oscillating signal CLK0 of the first oscillator 11, the motor controller circuit 30 may control a plurality of switch components, such as the first hide-side switch HS1, the second hide-side switch HS2, the first low-side switch LS1 and the second low-side switch LS2, respectively according to the first random number signals RNS10, RNS11, RNS12, RNS13 (or the first random number signal shown in FIG. 7). As a result, a state of the single-phase motor MT1 is controlled such that a current of the single-phase motor MT1 changes over time, thereby preventing an operation of the single-phase motor MT1 and other circuit components on a circuit board from being affected by electromagnetic interference.

If the first phase controller circuits 411, 412 and the second phase controller circuits 421, 422 are disposed, the motor controller circuit 30 may control the first phase controller circuits 411, 412 and the second phase controller circuits 421, 422 to respectively modulate phases of signals that will be outputted to the single-phase motor MT1 to control the state of the single-phase motor MT1, respectively according to the first random number signals RNS10, RNS11, RNS12, RNS13. For example, the modulated phase of the signal lags or leads the phase of the signal that is not modulated yet.

Second Embodiment

Figure 2:
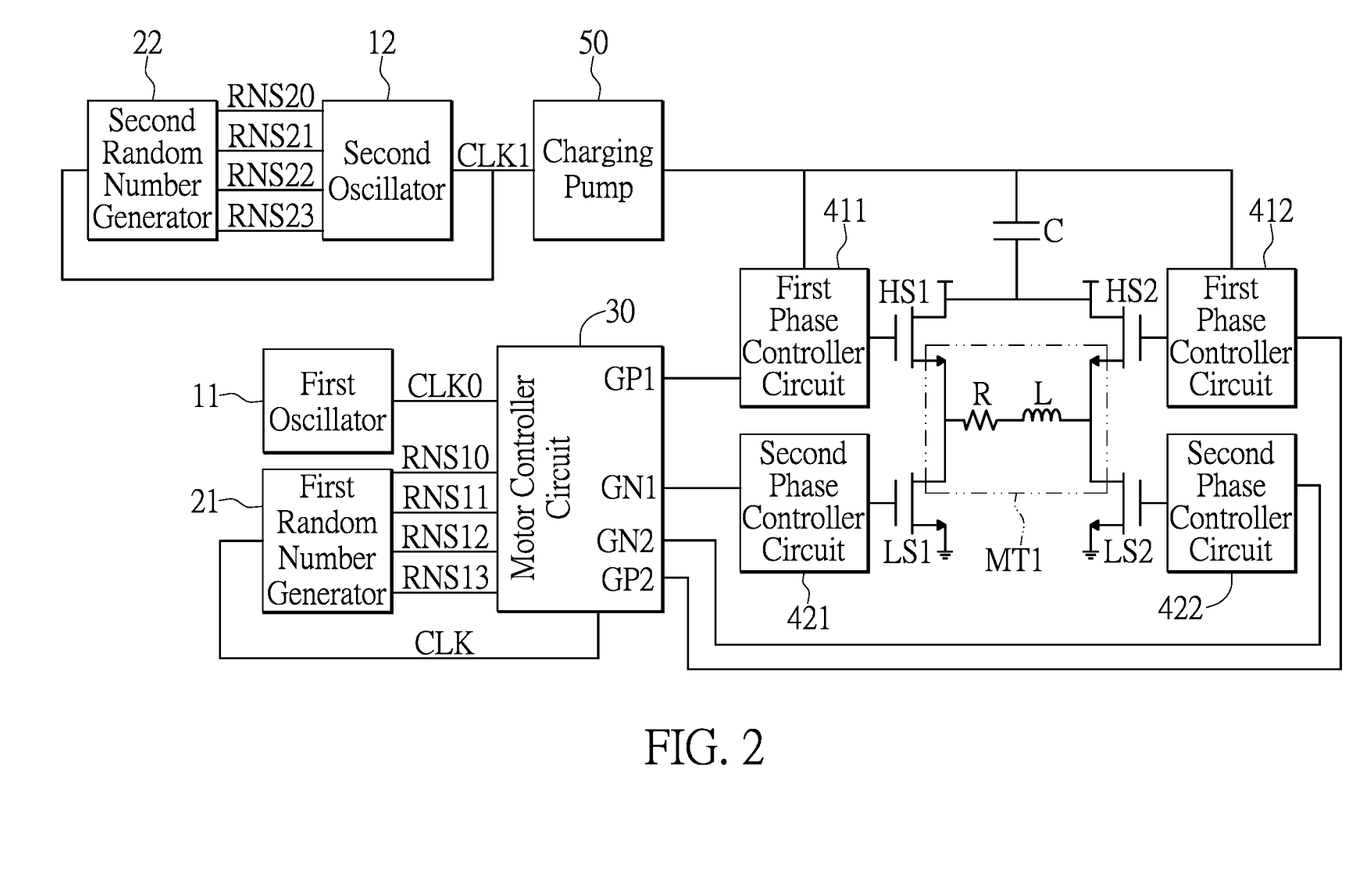
FIG. 2 is a circuit layout diagram of the electromagnetic interference reducing circuit, the single-phase motor, upper bridge switches that are NMOS transistors and the lower bridge switches that are NMOS transistors according to a second embodiment of the present disclosure.

Reference is made to FIG. 2, which is a circuit layout diagram of an electromagnetic interference reducing circuit, the single-phase motor, upper bridge switches that are NMOS transistors and the lower bridge switches that are NMOS transistors according to a second embodiment of the present disclosure.

The second embodiment is the same as the first embodiment in that, as shown in FIG. 2, the electromagnetic interference reducing circuit includes the motor controller circuit 30, the first phase controller circuits 411, 412 and the second phase controller circuits 421, 422 for the single-phase motor MT1. The single-phase motor MT1 is connected to the motor driver circuit. The motor driver circuit may include the plurality of switch components, such as the first hide-side switch HS1, the second hide-side switch HS2, the first low-side switch LS1 and the second low-side switch LS2 as shown in FIG. 2.

The same technical descriptions of the first embodiment of FIG. 1 and the second embodiment of FIG. 2 are not repeated herein, but differences between the first and second embodiments are described in the following.

As shown in FIG. 1, in the first embodiment, the first hide-side switch HS1 and the second hide-side switch HS2 are p-type metal oxide semiconductor (PMOS) field effect transistors. Therefore, only one random number generator and one oscillator need to be disposed. As shown in FIG. 1, the first random number generator 21 and the first oscillator 11 are disposed in the electromagnetic interference reducing circuit of the first embodiment. In contrast, in the second embodiment, the first high-bridge switch HS1 and the second high-bridge switch HS2 are n-type metal oxide semiconductor (NMOS) field effect transistors. The NMOS field effect transistor has a smaller size than the PMOS field effect transistor. Therefore, an overall product size and cost of the electromagnetic interference reducing circuit is reduced. However, voltages of the NMOS field effect transistors need to be pulled up and controlled. Therefore, two random number generators and two oscillators need to be disposed in the electromagnetic interference reducing circuit of the second embodiment.

That is, in the second embodiment, as shown in FIG. 2, the electromagnetic interference reducing circuit not only includes the first random number generator 21 and the first oscillator 11, but also includes a second random number generator 22, a second oscillator 12 and a charging pump 50 (or may be called a current pump). The second random number generator 22 and the first random number generator 21 are separately disposed and operate independently from each other. The second oscillator 12 is connected to the second random number generator 22 and the charging pump 50. The charging pump 50 may be connected to the first phase controller circuits 411, 412 of the motor driver circuit, and be connected to the first high-side bridge switch HS1 and the second high-side bridge switch HS2 through a capacitor C.

The second oscillator 12 outputs a second oscillating signal CLK1. Each time when the second oscillating signal CLK1 reaches a reference level such as a high level or a low level of or when the present time reaches a time point of a rising edge or a falling edge of one of waveforms of the second oscillating signal CLK1, the second random number generator 22 may be triggered to determine and generate a plurality of second random numbers. The second random number generator 22 outputs each of a plurality of second random number signals RNS20, RNS21, RNS22, RNS23 according to the second random numbers.

The second oscillator 12 may modulate the second oscillating signal CLK1 according to the second random number signals RNS20, RNS21, RNS22, RNS23. According to the modulated second oscillating signal CLK1, the charging pump 50 outputs power signals respectively to the first high-side switch HS1 through the first phase controller circuit 411 and the capacitor C, and to the second high-side switch HS2 through the second phase controller circuit 412 and the capacitor C. As a result, a voltage of the first high-side switch HS1 and a voltage of the second high-side switch HS2 increase to charge the single-phase motor MT1.

Third Embodiment

Figure 3:
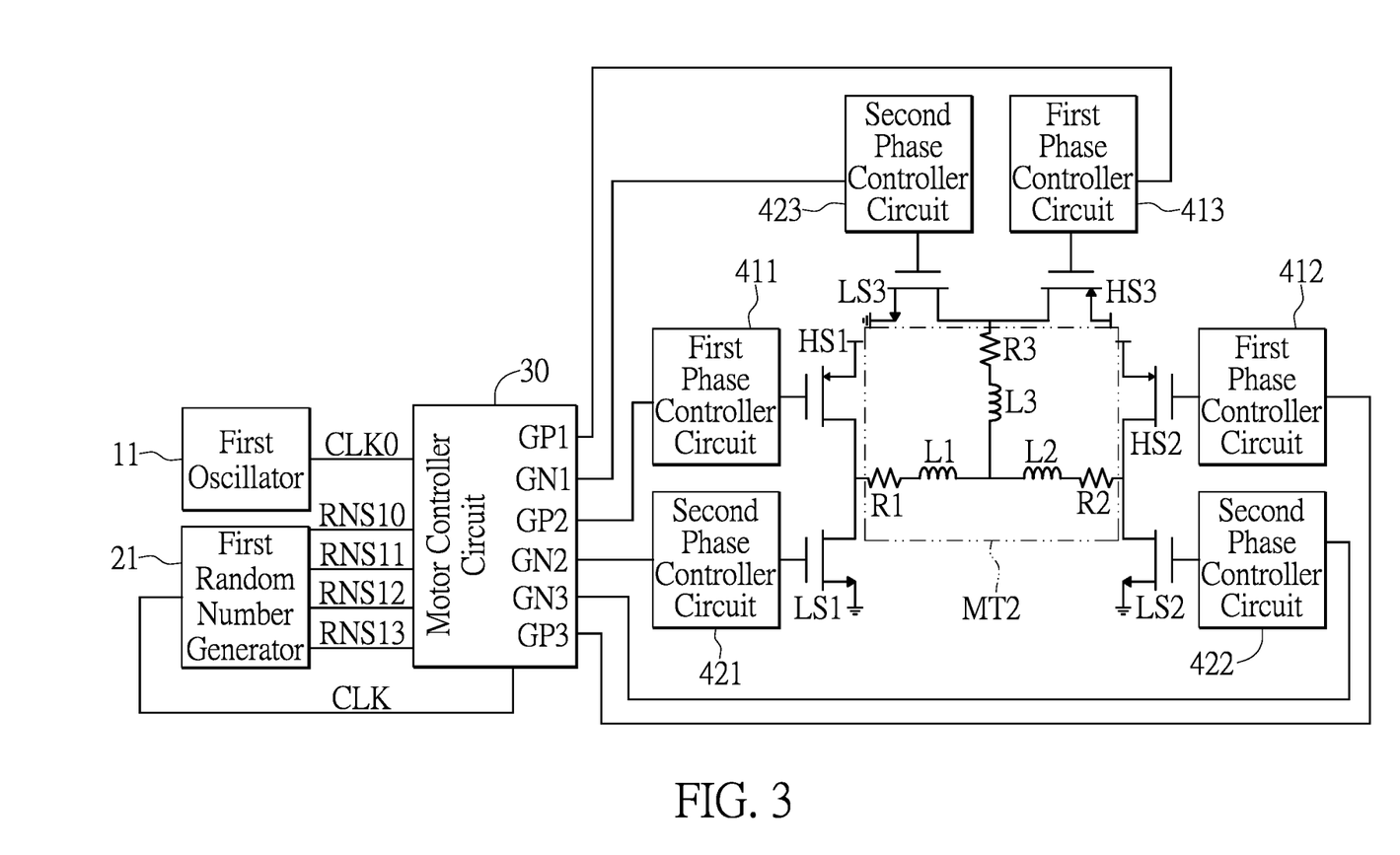
FIG. 3 is a circuit layout diagram of the electromagnetic interference reducing circuit, a three-phase motor, the upper bridge switches that are PMOS transistors and the lower bridge switches that are NMOS transistors according to a third embodiment of the present disclosure.

Reference is made to FIG. 3, which is a circuit layout diagram of an electromagnetic interference reducing circuit, a three-phase motor, upper bridge switches that are PMOS transistors and lower bridge switches that are NMOS transistors according to a third embodiment of the present disclosure.

The same technical descriptions of the first embodiment of FIG. 1 and the third embodiment of FIG. 3 are not repeated herein, but differences between the first and third embodiments are described in the following.

The electromagnetic interference reducing circuit shown in FIG. 1 is applied to the single-phase motor MT1, but the electromagnetic interference reducing circuit shown in FIG. 3 is applied to a three-phase motor MT2. Therefore, as shown in FIG. 3, the motor driver circuit not only incudes the first high-side switch HS1, the second high-side switch HS2, the first low-side switch LS1 and the second low-side switch LS2, but also includes a third high-side switch HS3 and a third low-side switch LS3. If necessary, the motor driver circuit may further include first phase controller circuits 411, 412, 413 and second phase controller circuits 421, 422, 423.

The first phase controller circuit 411 is connected to a control terminal of the first high-side switch HS1. The first phase controller circuit 412 is connected to a control terminal of the second high-side switch HS2. The first phase controller circuit 413 is connected to a control terminal of the third high-side switch HS3. The second phase controller circuit 421 is connected to the control terminal of the first low-side switch LS1. The second phase controller circuit 422 is connected to the control terminal of the second low-side switch LS2. The second phase controller circuit 423 is connected to a control terminal of the third low-side switch LS3.

A second terminal of the first high-side switch HS1 is connected to a first terminal of a resistor R1 of a V phase of the three-phase motor MT2. A second terminal of the second high-side switch HS2 is connected to a first terminal of a resistor R2 of a U phase of the three-phase motor MT2. A second terminal of the third high-side switch HS3 is connected to a first terminal of a resistor R3 of a W phase of the three-phase motor MT2.

A second terminal of the resistor R1 is connected to a first terminal of an inductor L1 of the three-phase motor MT2. A second terminal of the resistor R2 is connected to a first terminal of an inductor L2 of the three-phase motor MT2. A second terminal of the resistor R3 is connected to a first terminal of an inductor L3 of the three-phase motor MT2. A second terminal of the inductor L1, a second terminal of the inductor L2 and a second terminal of the inductor L3 are connected to a common node.

Output terminals GP1, GP2, GP3 of the motor controller circuit 30 are respectively connected to the first phase controller circuits 411, 412, 413. Output terminals GNU, GN2, GN3 of the motor controller circuit 30 are respectively connected to the second phase controller circuits 421, 422, 423. The motor controller circuit 30 may control the first phase controller circuits 411, 412, 41 and the second phase controller circuits 421, 422, 423 respectively to control and modulate phases of signals that will be outputted to the three-phase motor MT2, so as to control a state of the three-phase motor MT2. The modulated phase of the signal lags or leads the phase of the signal that is not modulated yet.

Fourth Embodiment

Figure 4:
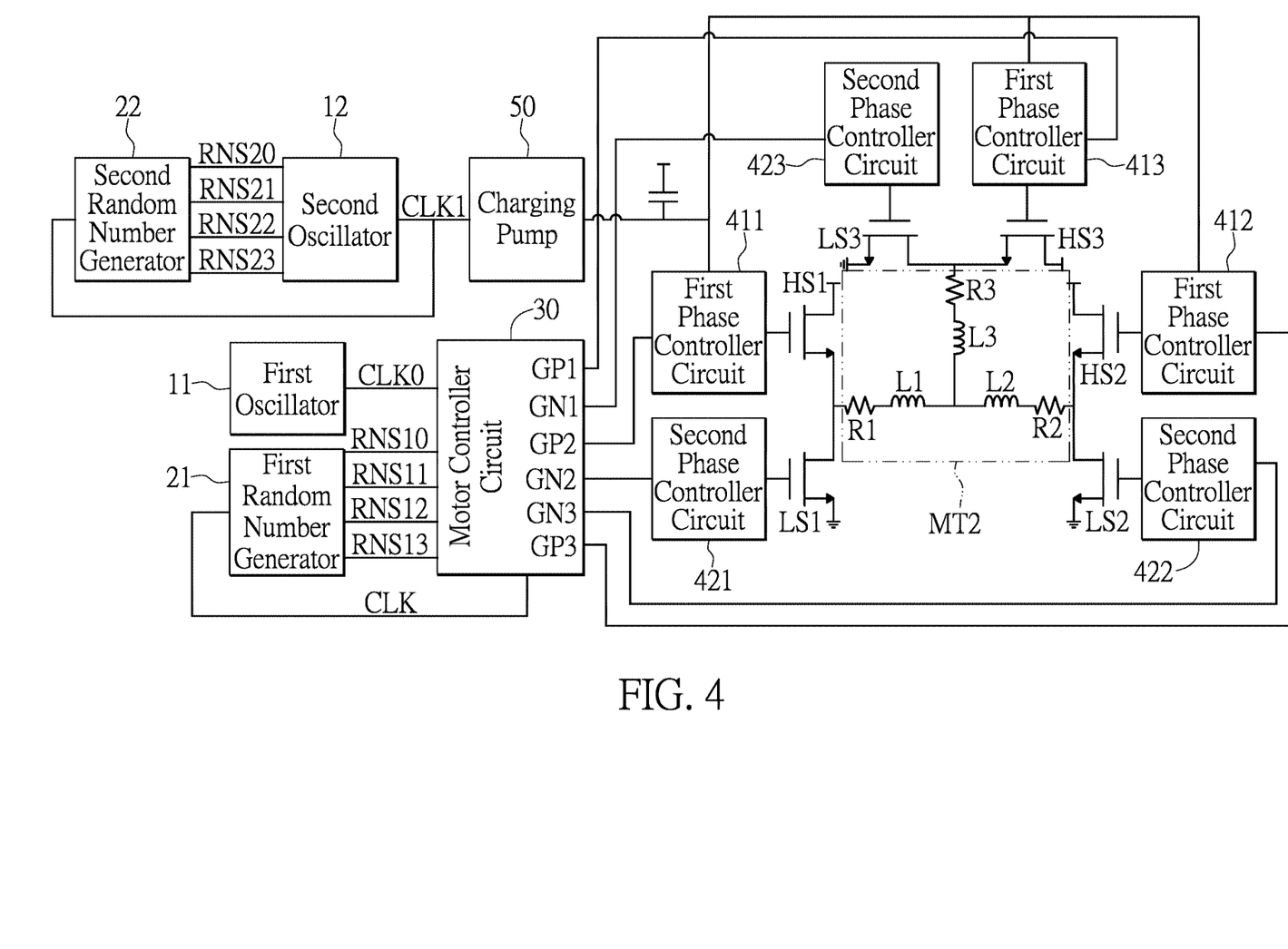
FIG. 4 is a circuit layout diagram of the electromagnetic interference reducing circuit, the three-phase motor, the upper bridge switches that are NMOS transistors and the lower bridge switches that are NMOS transistors according to a fourth embodiment of the present disclosure.

Reference is made to FIG. 4, which is a circuit layout diagram of an electromagnetic interference reducing circuit, the three-phase motor, upper bridge switches that are NMOS transistors and lower bridge switches that are NMOS transistors according to a fourth embodiment of the present disclosure.

A difference between the third embodiment of FIG. 4 and the second embodiment of FIG. 2 is that, the electromagnetic interference reducing circuit of FIG. 2 is applied to the single-phase motor MT1, but the electromagnetic interference reducing circuit of FIG. 4 is applied to the three-phase motor MT2. The same descriptions of the second to fourth embodiments of FIGS. 2 to 4 are not repeated herein, but differences of these embodiments are described in the following.

The second oscillator 12 may modulate the second oscillating signal CLK1 according to the second random number signals RNS20, RNS21, RNS22, RNS23. According to the modulated second oscillating signal CLK1, the charging pump 50 outputs power signals respectively to the first high-side switch HS1 through the first phase controller circuit 411, to the second high-side switch HS2 through the second phase controller circuit 412, and to the third high-side switch HS3 through the third second phase controller circuit 413. As a result, a voltage of the first high-side switch HS1, a voltage of the second high-side switch HS2 and a voltage of the third high-side switch HS3 are increased, such that a voltage the three-phase motor MT1 is charged to be equal to a constant target voltage.

Fifth Embodiment

Figure 5:
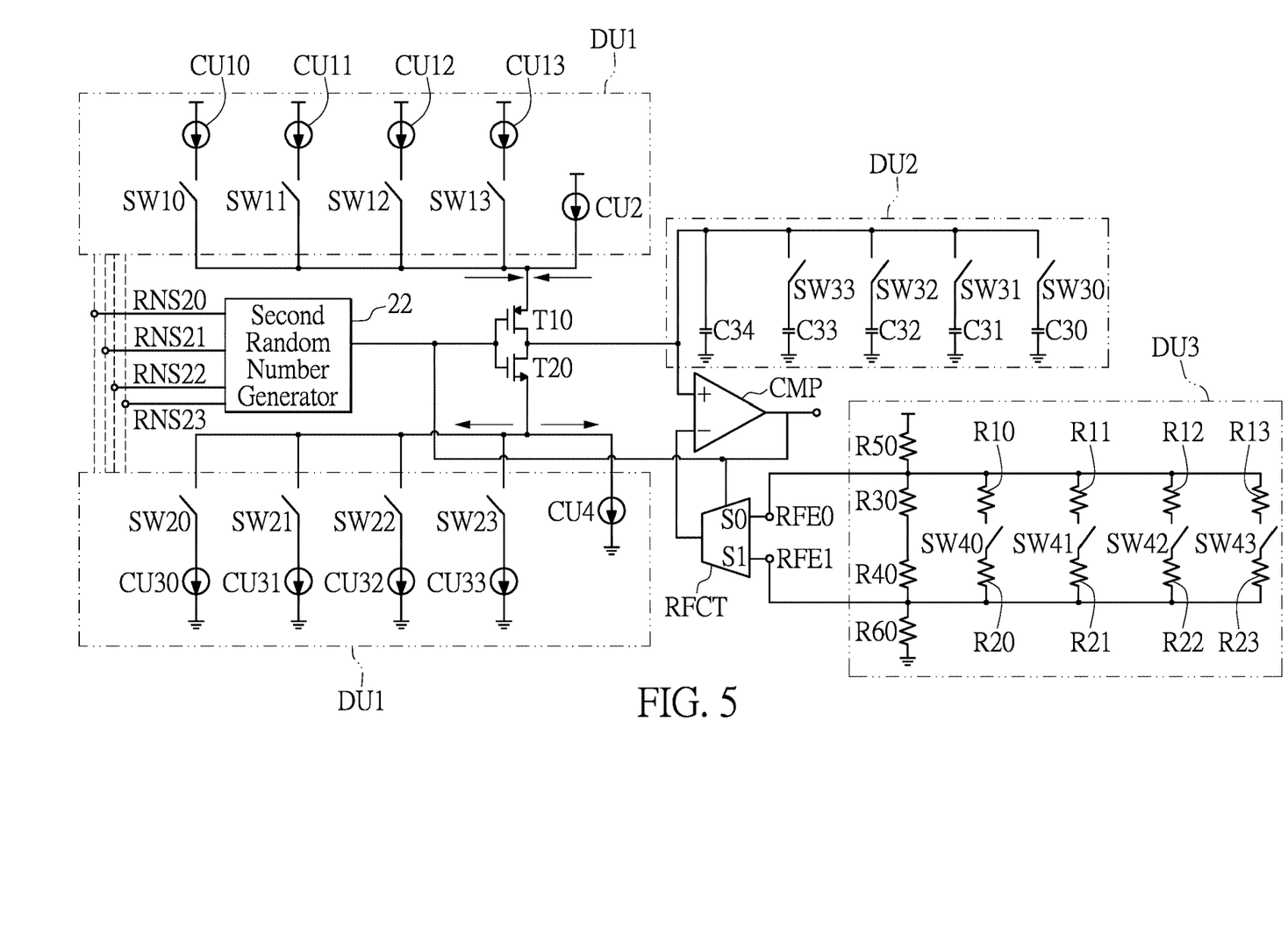
FIG. 5 is a circuit layout diagram of a second oscillator of the electromagnetic interference reducing circuit according to a fifth embodiment of the present disclosure.

Reference is made to FIG. 5, which is a circuit layout diagram of a second oscillator of the electromagnetic interference reducing circuit according to a fifth embodiment of the present disclosure.

The electromagnetic interference reducing circuit of the present embodiment includes a second oscillator such as the second oscillator 12 shown in FIGS. 2 and 4. As shown in FIG. 5, the second oscillator may include a first modulator circuit DU1, a second modulator circuit DU2, a third modulator circuit DU3, a first transistor T10, a second transistor T20, a comparator CMP, and a reference voltage circuit RFCT.

As shown in FIG. 5, a first terminal of the first transistor T10 is connected to the first modulator circuit DU1. A second terminal of the first transistor T10 is connected to a first terminal of the second transistor T20. A second terminal of the second transistor T20 is connected to the first modulator circuit DU1. A node between the second terminal of the first transistor T10 and the first terminal of the second transistor T20 is connected to the second modulator circuit DU2.

A first input terminal (such as a non-inverting input terminal) of the comparator CMP is connected to the node between the second terminal of the first transistor T10 and the first terminal of the second transistor T20, and is connected to the second modulator circuit DU2. A second input terminal (such as an inverting input terminal) of the comparator CMP and an output terminal of the comparator CMP are connected to the reference voltage circuit RFCT.

The second input terminal of the comparator CMP receives a reference voltage (from the reference voltage circuit RFCT). The comparator CMP compares a voltage of the first input terminal of the comparator CMP with a voltage of the second input terminal of the comparator CMP to output the second oscillating signal CLK1 as shown in FIGS. 2 and 4. The reference voltage circuit RFCT provides a reference voltage RFE0 or REF1 to the second input terminal of the comparator CMP according to the second oscillating signal CLK1 outputted by the comparator CMP.

The output terminal of the comparator CMP is connected to a control terminal of the first transistor T10 and a control terminal of the second transistor T20 as shown in FIG. 5, the second random number generator 22 shown in FIGS. 2, 4 and 5, and the charging pump 50 shown in FIGS. 2 and 4. The comparator CMP outputs the second oscillating signal CLK1 to the first transistor T10, the second transistor T20, the second random number generator 22 and the charging pump 50.

The first transistor T10 and the second transistor T20 may operate according to the second oscillating signal CLK1. Each time when one of waveforms of the second oscillating signal CLK1 reaches a reference level such as a low level or a high level, or when the present time reaches a time point of a rising edge or a falling edge of each of the waveforms of the second oscillating signal CLK1, the second random number generator 22 may output the plurality of second random number signals RNS20, RNS21, RNS22, RNS23.

The second random number generator 22 is connected to the first modulator circuit DU1, the second modulator circuit DU2 and the third modulator circuit DU3. The second random number generator 22 outputs the second random number signals RNS20, RNS21, RNS22, RNS23 for simultaneously controlling the first modulator circuit DU1 to modulate currents, the second modulator circuit DU2 to modulate capacitances or the third modulator circuit DU3 to modulate voltages. As a result, a frequency of the second oscillating signal CLK1 outputted by the comparator CMP of the second oscillator 12 changes.

The second oscillator 12 may adjust the second oscillating signal CLK1 that will be outputted to the charging pump 50 according to the second random number signals RNS20, RNS21, RNS22, RNS23. When the second oscillating signal CLK1 reaches a reference level such as a high level, the charging pump 50 is triggered to supply the power signal. In this way, a frequency of power supply from the charging pump 50 is adjusted, thereby preventing the motor from being affected by electromagnetic interference. As a result, a voltage of the single-phase motor MT1 shown in FIG. 2 and a voltage of the three-phase motor MT2 shown in FIG. 4 rise to a target voltage value and are stably maintained at the target voltage value.

For example, as shown in FIG. 5, the first modulator circuit DU1 may include a plurality of current sources CU10 to CU13 and a plurality of first switches SW10 to SW13. The first current sources CU10 to CU13 are respectively connected to first terminals of the first switches SW10 to SW13. A second terminal of each of the first switches SW10 to SW13 is connected to the first terminal of the first transistor T10. A control terminal of each of the first switches SW10 to SW13 is connected to the second random number generator 22.

The second random number generator 22 is connected to the first switches SW10 to SW13. The second random number generator 22 may output the second random number signals RNS20, RNS21, RNS22, RNS23 respectively for turning on or off the first switch SW10 to SW13, so as to optionally allow currents of the first current sources CU10 to CU13 to flow to the first transistor T10. As a result, the voltage of the first input terminal (such as the non-inverting terminal) of the comparator CMP changes, such that the frequency of the second oscillating signal CLK1 outputted by the comparator CMP is modulated. Therefore, the frequency of supplying the power by the charging pump 50 is adjusted.

The first modulator circuit DU1 may further include a second current source CU2, a plurality of second switches SW20 to SW23, a plurality of third current sources CU30 to CU33, and a fourth current source CU4. In practice, the first current source CU10 to CU13, the third current source CU30 to CU33, the second current source CU2, the fourth current source CU4 and other circuit components may form a current mirror. For example, currents of the second current source CU2 and the fourth current source CU4 may be output currents of the current mirror.

The second current source CU2 is connected to the first terminal of the first transistor T10. The second terminal of the second transistor T20 is connected to the fourth current source CU4 and a first terminal of each of the second switches SW20 to SW23. Second terminals of the second switches SW20 to SW23 are respectively connected to third current sources CU30 to CU33. A control terminal of each of the second switches SW20 to SW23 is connected to the second random number generator 22.

The second random number generator 22 may output the second random number signals RNS20, RNS21, RNS22, RNS23 respectively for turning on or off the second switches SW20 to SW23 to modulate the currents of the first transistor T10 and the second transistor T20. In this way, the voltage of the first input terminal (such as the non-inverting terminal) of the comparator CMP can be changed. As a result, the frequency of the second oscillating signal CLK1 outputted by the comparator CMP is modulated, such that the frequency of supplying the power by the charging pump 50 is adjusted.

For example, the second modulator circuit DU2 may include a plurality of third switches SW30 to SW33, a first capacitor C34, and a plurality of second capacitors C30 to C33. A first terminal of each of the third switches SW30 to SW33 and a first terminal of the first capacitor C34 are connected to the node between the first transistor T10 and the second transistor T20, and are connected to the first input terminal (such as the non-inverting terminal) of the comparator CMP. Second terminals of the third switches SW30 to SW33 are respectively connected to first terminals of the second capacitors C30 to C33. A second terminal of the first capacitor C34 and a second terminal of each of the second capacitors C30 to C33 are grounded.

The second random number generator 22 is connected to a control terminal of each of the third switches SW30 to SW33. The second random number generator 22 may output the second random number signals RNS20, RNS21, RNS22, RNS23 respectively for turning on or off the second switches SW20 to SW23 to allow currents to flow from the first transistor T10 optionally to the first capacitor C34 and the second capacitors C30 to C33 that may have different capacitors to each other, such that the voltage of the first input terminal (such as the non-inverting terminal) of the comparator CMP changes. As a result, the frequency of the second oscillating signal CLK1 outputted by the comparator CMP is modulated, such that the frequency of supplying the power by the charging pump 50 is adjusted.

For example, as shown in FIG. 5, the third modulator circuit DU3 may include a plurality of first resistors R10 to R13, a plurality of second resistors R20 to R23 and a plurality of fourth switches SW40 to SW43. A first terminal of each of the first resistors R10 to R13 is connected to a first input terminal S0 of the reference voltage circuit RFCT. Second terminals of the first resistors R10 to R13 are respectively connected to first terminals of the fourth switches SW40 to SW43. Second terminals of the fourth switches SW40 to SW43 are respectively connected to first terminals of the second resistors R20 to R23. A second terminal of each of the second resistors R20 to R23 is connected to a second input terminal S1 of the reference voltage circuit RFCT.

The second random number generator 22 may be connected to a control terminal of each of the fourth switches SW40 to SW43. The second random number generator 22 may output the second random number signals RNS20, RNS21, RNS22, RNS23 respectively for turning on or off the fourth switches SW40 to SW43, such that voltages of the reference voltages RFE0 and REF1 change. As a result, the voltage of the first input terminal (such as the non-inverting terminal) of the comparator CMP changes, such that the frequency of the second oscillating signal CLK1 outputted by the comparator CMP is modulated. Therefore, the frequency of supplying power by the charging pump 50 is adjusted.

If necessary, the third modulator circuit DU3 may further include a third resistor R30, a fourth resistor R40, a fifth resistor R50 and a sixth resistor R60. A first terminal of the third resistor R30 is connected to the first input terminal S0 of the reference voltage circuit RFCT. A second terminal of the third resistor R30 is connected to a first terminal of the fourth resistor R40. A second terminal of the fourth resistor R40 is connected to a first terminal of the sixth resistor R60. A second terminal of the sixth resistor R60 is grounded. A first terminal of the fifth resistor R50 is connected to a common voltage source. A second terminal of the fifth resistor R50 is connected to the first terminal of the third resistor R30.

The third resistor R30, the fourth resistor R40, the fifth resistor R50 and the sixth resistor R60 form a voltage divider circuit. A voltage of the common voltage source is divided by this voltage divider circuit, such that the reference voltage RFE0 or REF1 of the reference voltage circuit RFCT changes. As a result, the frequency of the second oscillating signal CLK1 outputted by the comparator CMP is modulated, such that the frequency of supplying power by the charging pump 50 is adjusted.

In summary, the present disclosure provides the electromagnetic interference reducing circuit, which has the following characteristics:

1. the charging pump supplies the power according to the second oscillating signal that is generated based on the second random number signals, such that the voltage of the high-side switch that is the NMOS transistor of the motor increases;
2. when different switch components are used, the second oscillator selects different currents, voltages or capacitances to generate the second oscillating signal having different frequencies according to the second random numbers generated by the second random number generator;
3. when the present time reaches the time point of the rising edge or the falling edge of the second oscillating signal, or the second oscillating signal reaches the high or low level, the waveform of a next cycle of the second oscillating signal is changed according to the second random numbers generated by the second random number generator;
4. the first oscillator and the first random number generator are used to provide a correct operational frequency of the motor controller circuit;
5. the first random number generator is used to generate the first random number signal and modulate the frequency of the first random number signal according to the first random numbers, such that the motor drive circuit is correctly turned on or off based on the modulated first random number signal;
6. the first random number generator and the motor controller circuit are applied to the motor driver circuit to drive the motor, such that the frequencies of the signals of the motor change, thereby preventing the motor from being affected by the electromagnetic interference;
7. the second random number generator and the second oscillator are applied to the motor driver circuit to drive the motor, such that that the frequencies of the signals of the motor change, thereby preventing the motor from being affected by the electromagnetic interference; and
8. the second oscillator modulates the second oscillating signal according to the second random numbers generated by the second random number generator, and the charging pump adjusts a frequency of charging the motor according to the second oscillating signal, thereby preventing the motor from being affected by the electromagnetic interference.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. An electromagnetic interference reducing circuit of a motor, wherein the motor is connected to a motor driver circuit, and the motor driver circuit includes a plurality of switch components connected to the motor, the electromagnetic interference reducing circuit comprising:

a first oscillator configured to generate a first oscillating signal;

a first random number generator configured to generate a plurality of first random number signals each having a plurality of triangular waves, wherein each of the triangular waves has a plurality of steps, and the first random number generator is configured to generate a plurality of first random numbers; wherein each time when a first clock signal reaches a reference level, the first random number generator modulates one of the triangular waves of each of the first random number signals according to one of the first random numbers; wherein the first random number generator repeatedly counts, repeatedly removes, or does not count time of the steps of each of the triangular waves of each of the first random number signals according to one of the first random numbers, such that each one of periods of the first random number signal is adjusted to be not equal to a next one of the periods of the first random number signal, and a number of the steps of each of the triangular waves that are repeatedly counted, repeatedly removed or not counted depends on the one first random number of each of the triangular waves; and a motor controller circuit connected to the first oscillator and the first random number generator, configured to receive the first oscillating signal from the first oscillator and output the first clock signal to the first random number generator, and configured to control the switch components respectively according to the first random number signals based on the first oscillating signal.

2. The electromagnetic interference reducing circuit according to claim 1, wherein, when a previous one of the triangular waves of each of the first random number signals falls to a valley value, the first random number generator generates the first random number of a next one of the triangular waves, and modulates a rising wave segment and a falling wave segment of the next one triangular wave of each of the first random number signals according to the first random number of the next one triangular wave.

3. The electromagnetic interference reducing circuit according to claim 1, wherein, when a rising wave segment of a previous one of the triangular waves of each of the first random number signals rises to a peak value, the first random number generator generates one of the first random numbers, and modulates a falling wave segment of the previous one of the triangular waves and a rising wave segment of a next one of the triangular waves of each of the first random number signals according to the one of the first random numbers.

4. The electromagnetic interference reducing circuit according to claim 1, wherein the motor driver circuit further includes a plurality of phase controller circuits, the phase controller circuits are connected to the motor controller circuit and are respectively connected to the plurality of switch components, and the motor controller circuit controls the phase controller circuits respectively to adjust phases of signals inputted to the motor through the switch components according to the first random number signals.

5. The electromagnetic interference reducing circuit according to claim 4, wherein the phase controller circuit includes a plurality of first phase controller circuits and a plurality of second phase controller circuits, the switch components include a plurality of high-side switches and a plurality of low-side switches, the hide-side switches are p-type metal oxide semiconductor (PMOS) field effect transistors and are respectively connected to the first phase controller circuits, and the low-side switches are n-type metal oxide semiconductor (NMOS) field effect transistors and are respectively connected to the second phase controller circuits.

6. The electromagnetic interference reducing circuit according to claim 5, wherein the phase controller circuit includes a plurality of first phase controller circuits and a plurality of second phase controller circuits, the switch components include a plurality of hide-side switches and a plurality of low-side switches, the hide-side switches are n-type metal oxide semiconductor field effect transistors and are respectively connected to the first phase controller circuits, and the low-side switches are n-type metal oxide semiconductor field effect transistors and are respectively connected to the second phase controller circuits.

7. The electromagnetic interference reducing circuit according to claim 6, further comprising:

a second random number generator, a second oscillator and a charging pump, wherein the second oscillator is connected to the second random number generator and the charging pump, the charging pump is connected to the first phase controller circuits, and the second oscillator outputs a second oscillating signal; wherein each time when the second oscillating signal reaches a reference level, the second random number generator generates a plurality of second random numbers and outputs a plurality of second random number signals respectively according to the second random numbers; wherein the second oscillator modulates the second oscillating signal according to the second random number signals, and the charging pump outputs a power signal to the motor sequentially through each of the first phase controller circuits and the high-side switches according to the second oscillating signal.

8. The electromagnetic interference reducing circuit according to claim 7, wherein the second oscillator includes a first transistor, a second transistor, a comparator, a reference voltage circuit, a first modulator circuit, a second modulator circuit and a third modulator circuit; wherein a first terminal of the first transistor and a second terminal of the first transistor are respectively connected to the first modulator circuit and a first terminal of the second transistor, the second random number generator is connected to the first modulator circuit, the second modulator circuit and the third modulator circuit, and the second random number generator outputs the second random number signals for simultaneously controlling the first modulator circuit, the second modulator circuit or the third modulator circuit;

wherein a first input terminal of the comparator is connected to the first terminal of the second transistor and the second modulator circuit, a second input terminal of the comparator and an output terminal of the comparator are connected to the reference voltage circuit, and the reference voltage circuit outputs a reference voltage to the second input terminal of the comparator according to the second oscillating signal outputted by the comparator; wherein the output terminal of the comparator is connected to a control terminal of the first transistor, a control terminal of the second transistor, the second random number generator and the charging pump, and the comparator outputs the second oscillating signal to the first transistor, the second transistor, the second random number generator and the charging pump.

9. The electromagnetic interference reducing circuit according to claim 8, wherein the first modulator circuit includes a plurality of first current sources and a plurality of first switches, the first current sources are respectively connected to first terminals of the first switches, a second terminal and a control terminal of each of the first switches are respectively connected to the first terminal of the first transistor and the second random number generator, and the second random number generator outputs the second random number signals for respectively controlling the first switches.

10. The electromagnetic interference reducing circuit according to claim 9, wherein the first modulator circuit further includes a second current source connected to the first terminal of the first transistor.

11. The electromagnetic interference reducing circuit according to claim 10, wherein the first modulator circuit further includes a plurality of second switches and a plurality of third current sources, a first terminal of each of the second switches is connected to a second terminal of the second transistor, second terminals of the second switches are respectively connected to the third current sources, a control terminal of each of the second switches is connected to the second random number generator, and the second random number generator outputs the second random number signals for respectively controlling the second switches.

12. The electromagnetic interference reducing circuit according to claim 11, wherein the first modulator circuit further includes a fourth current source connected to the second terminal of the second transistor.

13. The electromagnetic interference reducing circuit according to claim 12, wherein the second modulator circuit includes a plurality of third switches, a first capacitor and a plurality of second capacitors, a first terminal of each of the third switches and a first terminal of the first capacitor are connected to the first input terminal of the comparator, second terminals of the third switches are respectively connected to first terminals of the second capacitors, a second terminal of the first capacitor and a second terminal of each of the second capacitors are grounded, and the second random number generator is connected to a control terminal of each of the third switches and outputs the second random number signals for respectively controlling the third switches.

14. The electromagnetic interference reducing circuit according to claim 13, wherein the third modulator circuit includes a plurality of first resistors, a plurality of second resistors and a plurality of fourth switches, a first terminal of each of the first resistors is connected to a first input terminal of the reference voltage circuit, second terminals of the first resistors are respectively connected to first terminals of the fourth switches, second terminals of the fourth switches are respectively connected to first terminals of the second resistors, a second terminal of each of the second resistors is connected to a second input terminal of the reference voltage circuit, and the second random number generator is connected to a control terminal of each of the fourth switches and outputs the second random number signals for respectively controlling the fourth switches.

15. The electromagnetic interference reducing circuit according to claim 14, wherein the third modulator circuit further includes a third resistor, a fourth resistor, a fifth resistor and a sixth resistor, a first terminal of the third resistor is connected to the first input terminal of the reference voltage circuit, a second terminal of the third resistor is connected to a first terminal of the fourth resistor, a second terminal of the fourth resistor is connected to a first terminal of the sixth resistor, a second terminal of the sixth resistor is grounded, a first terminal of the fifth resistor is connected to a common voltage source, and a second terminal of the fifth resistor is connected to the first terminal of the third resistor.

* * * * *